United States Patent [19]
Kumasaka et al.

[11] Patent Number: 5,949,179
[45] Date of Patent: Sep. 7, 1999

[54] PIEZOELECTRIC TRANSFORMER AND POWER SUPPLY INCLUDING THE SAME

[75] Inventors: Katsunori Kumasaka, Soma; Hiroyuki Sato, Sendai, both of Japan

[73] Assignee: Tokin Corporation, Miyagi, Japan

[21] Appl. No.: 09/136,496

[22] Filed: Aug. 19, 1998

[30] Foreign Application Priority Data

| Aug. 19, 1997 | [JP] | Japan | 9-222740 |
| Oct. 17, 1997 | [JP] | Japan | 9-285612 |
| Oct. 17, 1997 | [JP] | Japan | 9-285616 |
| Oct. 17, 1997 | [JP] | Japan | 9-285618 |

[51] Int. Cl.$^6$ .................................................. H01L 41/08
[52] U.S. Cl. ........................ 310/348; 310/359; 310/366
[58] Field of Search ................................ 310/359, 366, 310/348

[56] References Cited

U.S. PATENT DOCUMENTS

| 5,696,422 | 12/1997 | Hanson et al. | 310/344 |
| 5,847,490 | 12/1998 | Kumasaka et al. | 310/348 |

FOREIGN PATENT DOCUMENTS

| 0693790 | 1/1996 | European Pat. Off. | H01L 41/07 |
| 9743791 | 5/1997 | Japan | H01L 41/107 |

*Primary Examiner*—Thomas M. Dougherty
*Attorney, Agent, or Firm*—Hopgood, Calimafde, Kalil & Judlowe

[57] ABSTRACT

A power supply including a piezoelectric transformer mounted and electrically connected to a defined board region of a printed circuit board having circuit components for forming the power supply together with the piezoelectric transformer. The transformer has FPC for connecting the transformer and the printed circuit board and is bound together with the board region by a wrapping sheet. In an embodiment, the board region is defined by a slit through which the wrapping sheet is wrapped. In another embodiment, the FPC has lugs standing up thereon to connect with the electrodes of the transformer. In another embodiment, a hard plate supports and covers the FPC and the transformer on the printed circuit board. In the other embodiment, the FPC is formed into a cover case and covers and holds the transformer element when is fixed to the printed circuit board.

13 Claims, 10 Drawing Sheets

PIEZOELECTRIC TRANSFORMER AND POWER SUPPLY INCLUDING THE SAME

BACKGROUND OF THE INVENTION

1. Technical Field

The present invention relates to a piezoelectric transformer and a power supply including the piezoelectric transformer.

2. Background Art

As is known in the art, the piezoelectric transformer uses a piezoelectric vibrator. The piezoelectric vibrator has at least one pair of drive electrodes formed on and/or in a piezoelectric-ceramic plate. When an AC voltage is applied to the pair of drive electrodes, the plate vibrates due to the piezoelectric effect with a resonant mode such as a single wavelength resonant mode. When the plate is vibrating, variation of voltage potential is generated at any position of the plate. The variable voltage potential can be taken out from an output electrode formed on the position. A pair of output electrodes can be formed at different positions on the plate. Thus, the AC voltage applied to the drive electrodes as primary electrodes is transformed and is obtained at the output electrodes as secondary electrodes.

The piezoelectric transformer is used in a power supply in a circuit, for example, a lighting circuit of a back light for a liquid crystal display, a charging circuit for toner in a copying machine, or others. In the use, the piezoelectric transformer is mounted on and connected to a printed circuit board having other circuit components for the power supply.

Since it is important for the piezoelectric transformer that the piezoelectric plate vibrates, it is a serious problem to support the transformer without suppression of the vibration. A waveform of the vibration has vibration nodes and antinodes. Therefore, the transformer is supported at positions corresponding to the vibration nodes.

On the other hand, leads must be required to connect the transformer to the printed circuit board so as to apply the input voltage to the primary electrodes and take out the transformed voltage from the secondary electrodes. Usually, lead wires are connected to the primary electrodes and the secondary electrodes. However, the lead connection points are not always at positions corresponding to the vibration antinodes. The lead wires should be free without tension so as to interfere the vibration of the piezoelectric plate. The lead wires are troublesome for assembling, maintenance and other deal of an electrical circuit device such as the power supply, especially, a small size device.

Further, the primary and secondary electrodes are formed on different surfaces of the piezoelectric plate. Therefore, mounting and wiring operation of the transformer on a circuit board is complex. This results in large space for mounting the transformer on the circuit board and also in a high cost and large size of the circuit device.

Moreover, it is desired that the power supply has any safety provision because the piezoelectric transformer generates a high voltage.

Therefore, it is an object of the present invention to provide the piezoelectric transformer which has a simple structure of connection with an external circuit and is small sized.

It is another object of the present invention to provide a power supply including the piezoelectric transformer which is safe from the high voltage produced.

SUMMARY OF THE INVENTION

The present invention provides a small-sized piezoelectric transformer with a connection lead structure mounted on one surface of the piezoelectric plate. The connection lead structure is for connecting the transformer with an external circuit with simple operation.

The present invention is directed to a piezoelectric transformer comprising a transformer element and a connection lead structure coupled to the transformer element for connecting the transformer element with an external circuit. The transformer element comprises:

- a rectangular plate made of a piezoelectric ceramic and having a first surface and side surfaces;
- at least one pair of primary electrodes provided to the rectangular plate for receiving a driving voltage as a primary voltage to drive vibration of the rectangular plate by the piezoelectric effect;
- input terminal electrodes formed on the rectangular plate partially exposed on the first surface and connected to pair of electrodes, respectively; and
- at least one secondary electrode formed at a region of the rectangular plate where a voltage potential is generated by the vibration of the rectangular plate due to the piezoelectric effect, the secondary electrode having an output terminal electrode portion extending to expose on the first surface of the rectangular plate.

The connection lead structure comprises:

a flexible flat sheet of insulator material; and a plurality of conductor strips formed in the flat sheet and having connection portions partially exposed out of the flat sheet, the input and output terminal electrodes being mechanically and electrically connected to a corresponding one of the connection portions in the condition that the transformer element stands on the flat sheet with the first surface of the rectangular plate overlying the flat sheet.

In an aspect of the present invention, the flat sheet is generally in a shape of a ladder and has a plurality of lugs standing up from the ladder shape at positions corresponding to the input electrodes and the secondary and/or output electrodes, the conductor strips extending through and partially exposed out of the lugs.

In a further aspect of the present invention, a power supply is obtained by mounting the piezoelectric transformer onto a defined board region of a printed circuit board having circuit components forming a power supply together with the piezoelectric transformer, and by wrapping the transformer element, the connection lead structure and the board region of the printed circuit board by a wrapping sheet through the slit to form a power supply.

In the transformer according to another aspect of the present invention, the flat sheet has a shape of rectangle with a large central hole, the connection lead structure further comprises a hard insulator plate with a large central hole, the flat sheet also having a shape of rectangle with a large central hole and bonded onto the insulator plate, and lead means connected to the conductor strips and projecting from the connection lead structure for connecting with external circuit.

In another aspect of the present invention, the flat sheet is formed into a cover case, the cover case having spring members as terminal pieces as the connection portions.

DESCRIPTION OF PREFERRED EMBODIMENTS

Prior to description of preferred embodiments, the prior art will be described with reference to FIGS. 1 through 4 so as to facilitate the better understanding of the present invention.

Figure 1:
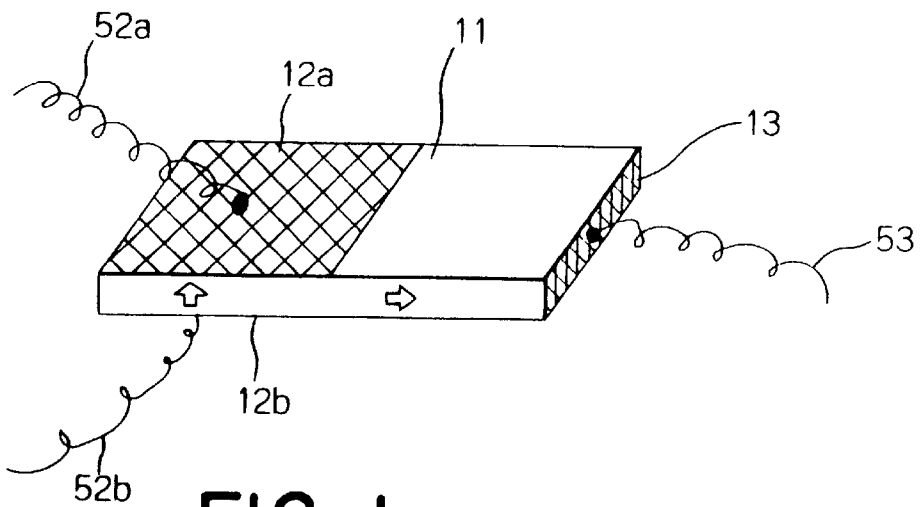
FIG. 1 is a perspective view of an example of a known piezoelectric transformer.

Referring to FIG. 1, a known piezoelectric transformer shown therein comprises a rectangular plate 11 of a piezoelectric-ceramic material, a pair of primary electrodes 12a and 12b, and a secondary electrode 13 formed on an end surface of the plate 11.

As the piezoelectric-ceramic materials used in the piezoelectric transformer, there are known ceramics of Pb (FeNb) $ZrTiO_3$ type, $Pb(MnSb)ZrTiO_3$ type, $Pb(MnNb)ZrTiO_3$ type, $Pb(FeSb)ZrTiO_3$ type, and the like.

The primary electrodes 12a and 12b are formed on the opposite surfaces of a right half portion (as viewed in the figure) of the plate 11. The half portion of the plate 11 is polarized in the thickness direction as shown by an arrow.

Figure 4:
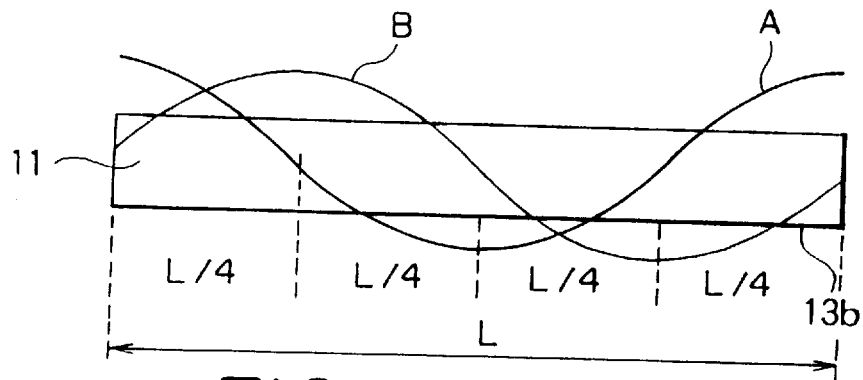
FIG. 4 is a diagrammatic view illustrating vibration of a piezoelectric plate.

The piezoelectric-ceramic rectangular plate 11 with the primary electrodes 12a and 12b is known as a piezoelectric vibrating element. In detail, when an AC voltage is applied across the pair of primary electrodes 12a and 12b, the plate 11 vibrates with a wavelength equal to the length L of the plate 11 as shown in FIG. 4 where two waveforms A and B are shown as displacement distribution and a strain distribution of the plate, respectively. Vibration nodes and antinodes are alternately present at intervals of L/4. The primary electrodes 12a and 12b are rather referred to as drive electrodes in the vibrating element.

Returning to FIG. 1, the other half portion of the plate 11 is polarized in the lengthwise direction as shown by another arrow. When the piezoelectric-ceramic plate 11 vibrates, an AC voltage is resulted from the secondary electrode 13. Thus, when an AC voltage is applied to the primary electrodes 12a and 12b, a secondary output voltage is obtained from the secondary electrode 13. One of the primary electrodes 12a and 12b, for example, electrode 12b is used in common for the secondary side, that is, the secondary output is obtained across the primary electrode 12b and secondary electrode 13.

In order to apply the primary voltage to the primary electrodes 12a and 12b, input lead wires 53a and 52b are connected to the primary electrodes 12a and 12b at a vibration antinode, respectively, by soldering method. On the other hand, an output lead wire 53 is also connected to the secondary electrode 13 by soldering method.

Figure 2:
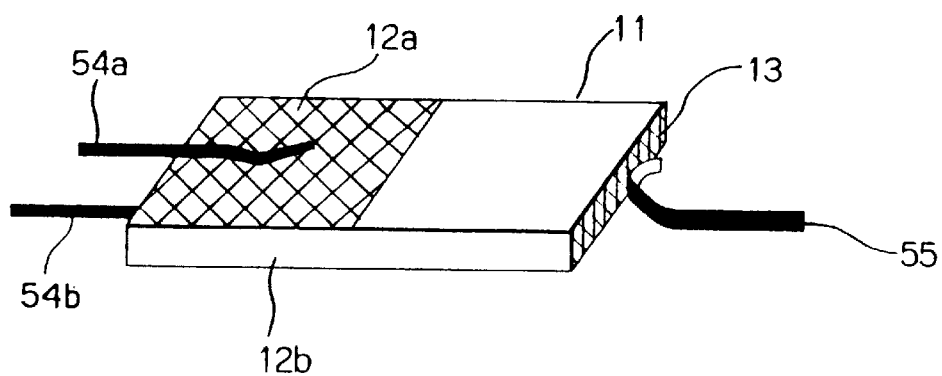
FIG. 2 is a perspective view of another example of a known piezoelectric transformer.
Figure 3:
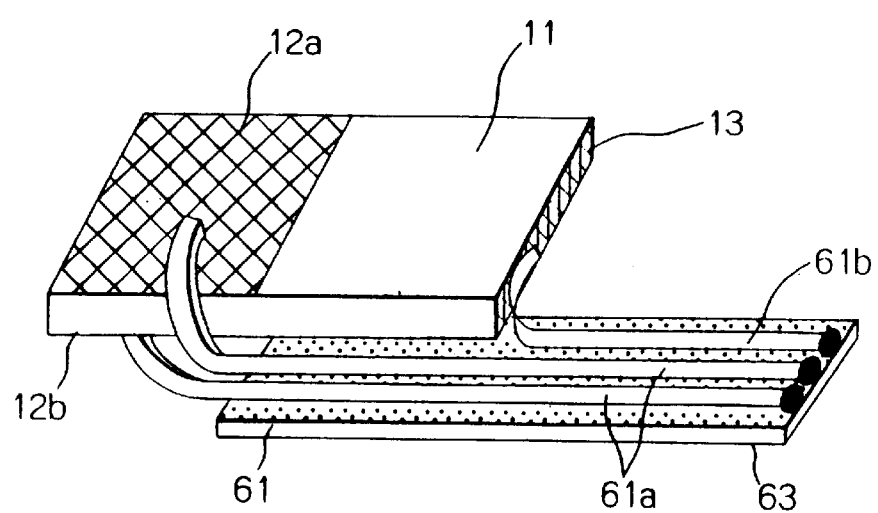
FIG. 3 is a perspective view of another example of a known piezoelectric transformer.

There are also known other structures for connecting input leads and output lead to the primary electrodes 12a and 12b and the secondary electrode 13, respectively, as shown in FIGS. 2 and 3.

Referring to FIG. 2, elastic conductor ribbons 54a and 54b and 55 are used in place of wires and are connected to the primary electrodes 12a and 12b and secondary electrode 13 by soldering method or pressure welding method.

Referring to FIG. 3, a flexible flat cable 61 is used in place of the lead wires and elastic conductor ribbons. The flexible flat cable 61 comprises conductor strips 61a and 61b deposited or formed on a flexible plastic sheet 63. End portions of conductor strips 61a and 61b are led out from the flexible plastic sheet 61 and are connected to the primary electrodes 12a and 12b and secondary electrode 13 by soldering method or pressure welding.

The piezoelectric transformer is formed small in size, especially, in thickness. Therefore, it is useful in an electronic circuit device which is integrated in a small size. However, the known structures are complex in connection of electrodes with leads and have disadvantages as described in the preamble.

Now, the present invention will be described with reference to embodiments shown in FIGS. 5 through 20.

Figure 5:
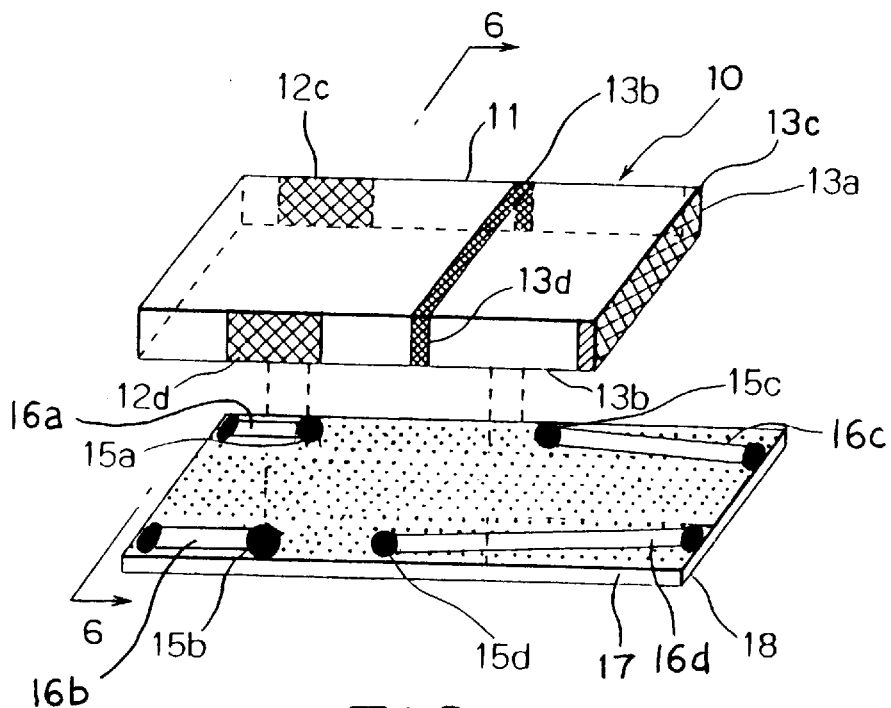
FIG. 5 is an exploded view of a piezoelectric transformer according to one embodiment of the present invention.
Figure 6:
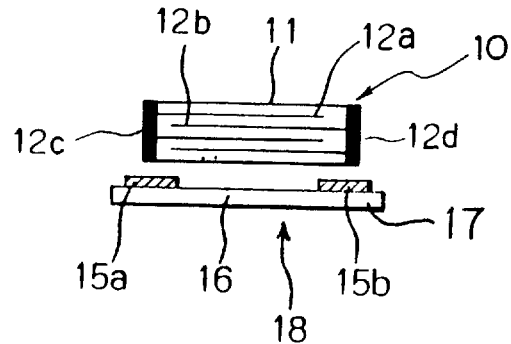
FIG. 6 is a sectional view taken along a line 6—6 in FIG. 5.

Referring to FIGS. 5 and 6, there is shown a piezoelectric transformer according to an embodiment of the pre sent invention which comprises a transformer element 10 and a connection lead structure 18. The transformer element 10 has a structure which is similar to one as shown in FIG. 1 but has several differences. The similar portions are represented by the same reference symbols as in FIG. 1. With respect to the differences, a plurality of pairs of primary electrodes 12a and 12b are formed in the half portion of the piezoelectric-ceramic plate 11 as shown in FIG. 6. A pair of input terminal electrodes 12c and 12d are formed on opposite side surfaces of the half portion of the plate 11. One 12c of the input terminal electrodes are connected to the one electrodes 12a of paired primary electrodes, while the other 12d of the input terminal electrodes is connected to the other ones 12b of the paired primary electrodes. Further, an additional secondary electrode 13b is formed on the surface at the middle portion of the plate 11 in addition to the secondary electrode 13a formed on the end surface of the plate 11. This means that the output voltage can be obtained across the secondary electrodes 13a and 13b without one of the primary electrodes being used in common for the secondary side. The secondary electrode 13a and 13b extends onto the side surfaces of the plate to form small side electrodes as output terminal electrodes 13c and 13d.

The transformer element 10 is provided with the connection lead structure 18 which comprises a plurality of conductor strips 16a–16d insulated by and covered with a flexible plastic sheet 17 of, for example, polyimide resin or polyester resin. The conductor strips 16a–16d have connection pads 15a–15d exposed out of the plastic sheet for electrical and mechanical connection with the input terminal electrodes 12c and 12d and 13c and 13d, respectively, by soldering method, when the transformer is mounted on the connection lead structure 18. The connection lead structure 18 can be formed in a manner similar to a so-called flexible printed circuit (FPC) or a so-called flexible flat cable (FFC).

The connection lead structure 18 is also provided with terminal pads (as shown at black circles at right and left ends of the structure 18 in the figure) of conductor strips 16a–16d which can be easily connected with an external circuit.

In use of the transformer with the connection lead structure, operation for mounting on a circuit board and connecting thereto or other circuit elements is readily carried out without troublesome of treatment of lead wires.

Figure 7:
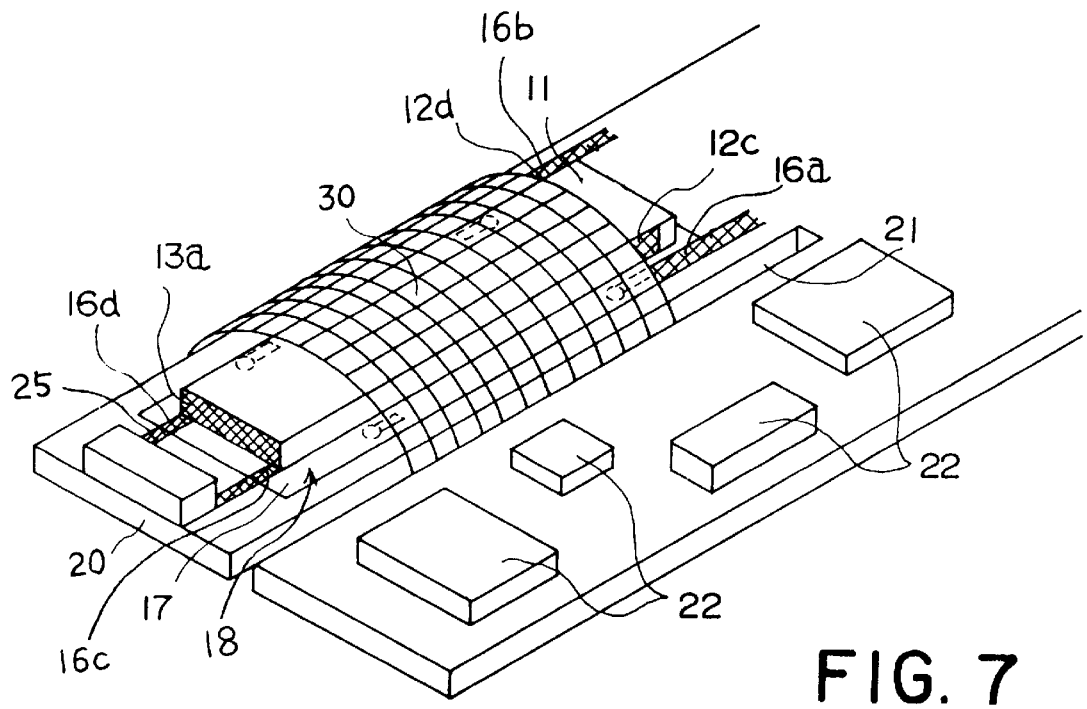
FIG. 7 is a perspective view of a power supply including the piezoelectric transformer of FIGS. 5 and 6 according to one embodiment of the present invention.

Referring to FIG. 7, an electric power supply device shown therein uses the piezoelectric transformer shown in FIGS. 5 and 6. The piezoelectric transformer with the connection lead structure 18 or FPC 17 is mounted on a printed circuit board 20 and wrapped by a wrapping sheet 30 together. In detail, the printed circuit board 20 has a slit 21 extending from an edge inwardly to thereby separate a board region on which the piezoelectric transformer is mounted and another board region on which other circuit components 22 are mounted.

The wrapping sheet 30 wraps the transformer element 10, the FPC 17 and the transformer mounting region of the printed circuit board 20 together, and is fixed by an adhesive tapes 21 in the wrapping condition. It is possible to use the heat-shrinkable tube as the wrapping sheet 20.

Figure 8:
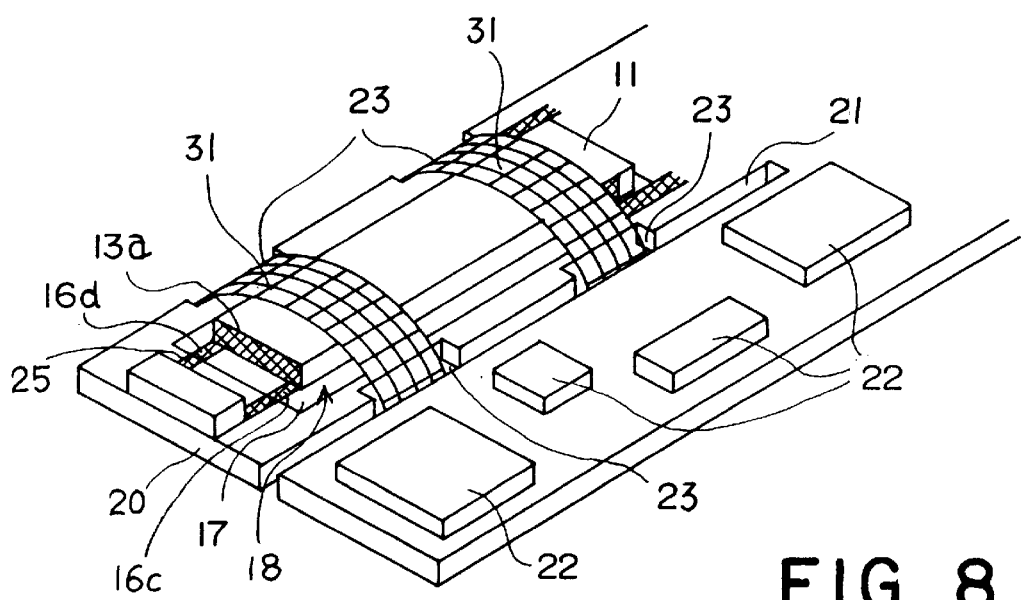
FIG. 8 is a perspective view of a power supply according to another embodiment.

Referring to FIG. 8, two wrapping bands 31 and 31 are used in place of the wrapping sheet 30 in FIG. 7 to cover and grasp the piezoelectric transformer element 10, the FPC 17, and the transformer mounting region of the printed circuit board 20 at positions in the vicinity of the vibration nodes of the piezoelectric plate 11. The printed circuit board 20 is preferably provided with cut-away portions 23 (four cut-away portions are shown in the figure) formed in edges of the slit 21 and opposite or parallel end of the printed circuit board 20 for receiving the wrapping bands 31 as shown in the figure. Thus, the piezoelectric transformer is correctly positioned on the transformer mounting region and the wrapping bands 31 are also positioned at positions corresponding to the vibration nodes of the plate 11.

EXAMPLE 1

In an example, the transformer element 10 was formed by forming ten rectangular green sheets of PZT piezoelectric ceramic, printing primary electrode patterns of Ad/Pd on the green sheets, stacking and sintering the green sheets to form a hard rectangular ceramic plate 11 having a size of 40 mm×6 mm×1.5 mm with the primary electrodes 12a and 12b. Thereafter, the input terminal electrodes 12c and 12d, the secondary electrode 13a and 13b with output terminal electrodes 13c and 13d are formed on the plate 11 by firing Ag paste. Thus, several samples of the piezoelectric transformer element were prepared. Then, the sample transformer elements were connected to the connection lead structures 18 and mounted on printed circuit boards to form power supply devices as shown in FIGS. 7 and 8, respectively. For a comparison, a sample transformer element was also mounted on and connected by lead wires as shown in FIG. 1 to a printed circuit board. Thus, a comparing power supply was also prepared.

The power supplies of FIG. 7, FIG. 8 and the comparing one were individually tested by driving a cold cathode ray tube having a length of 200 mm and a diameter of 2 mm. In the test, the output voltage and current and the temperature were measured. The measured data are demonstrated in Table 1.

TABLE 1

|  | Lead Wire | FIG. 7 | FIG. 8 |
|---|---|---|---|
| Qm | — | 720 | 730 |
| Output Voltage (V) | 1410 | 1435 | 1440 |
| Output Current (mA) | 6 | 6.2 | 6.3 |
| Temperature (°C.) | 33 | 31 | 30 |

It is noted from Table 1 that the power supplies according to the embodiments of the present invention have properties similar to the power supply having a known transformer of the lead wire type.

Further, it was confirmed from an aging test that the power supplies of FIGS. 7 and 8 did not degrade in its performances after use of 1000 hours or more.

Figure 9:
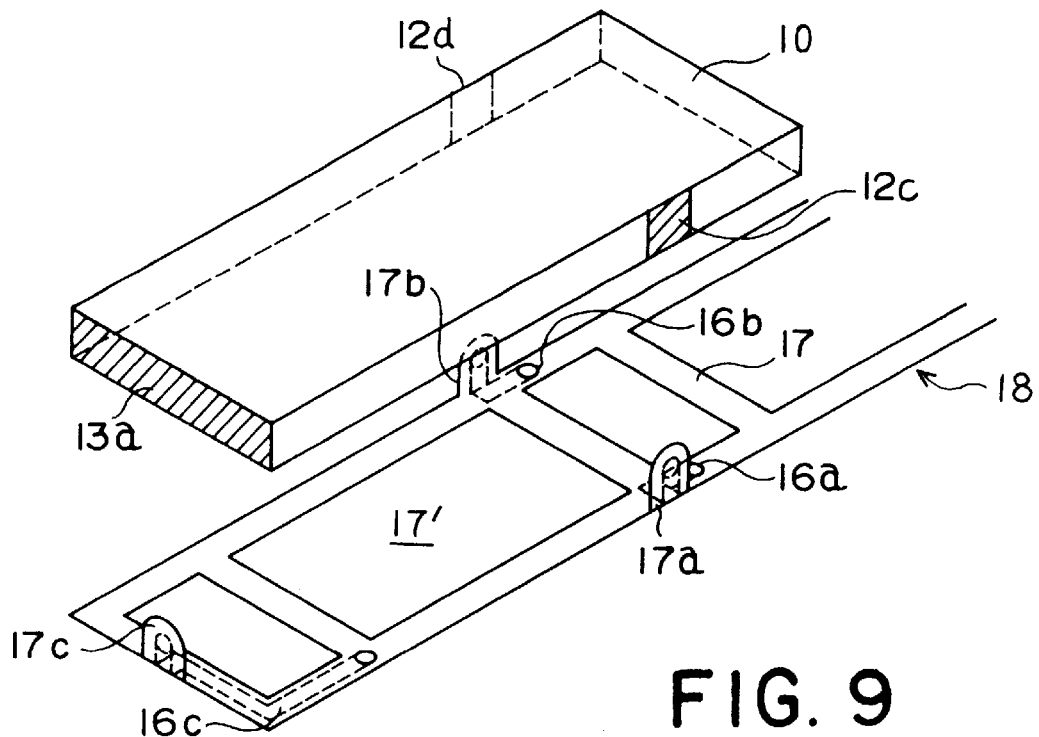
FIG. 9 is an exploded view of a piezoelectric transformer according to another embodiment of the present invention.

Referring to FIG. 9, there is shown another piezoelectric transformer with the connection lead structure 18. The transformer element 10 is different from the element 10 in FIGS. 5 and 6 in that the secondary electrodes 13a is only formed on one end surface of the rectangular plate 11. The connection lead structure 18 is also different from that in FIGS. 5 and 6. The flexible plastic sheet or FPC 17 has a plurality of large holes 17' to be formed into a shape like a ladder and has a three lugs 17a, 17b and 17c standing up at positions corresponding to the input terminal electrodes 12c and 12d and the secondary electrode 13a. Strip-like conductors 16a, 16b and 16c extend from the lugs 17a, 17b and 17c through the sheet 17 to terminals to be connected to external circuit. Those conductors 16a, 16b and 16c are partially exposed out of the sheet at the lugs 17a, 17b and 17c so as to be brought into contact with the input terminal electrodes 12c and 12d and the secondary electrode 13a, when the piezoelectric transformer element 10 is put on the FPC 17. The conductors in lugs 17a–17c are fixed and electrically connected by soldering to the electrodes 12d, 12d and 13a, respectively.

Figure 10:
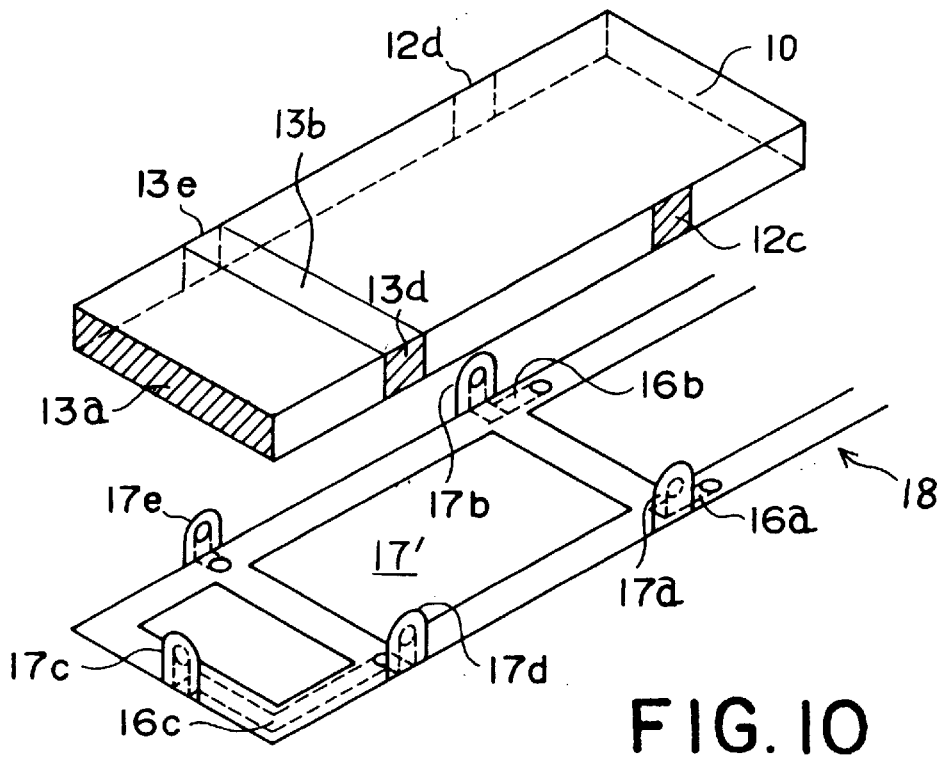
FIG. 10 is an exploded view of a piezoelectric transformer according to another embodiment of the present invention.

Referring to FIG. 10, there is shown a modification of the piezoelectric transformer in which the piezoelectric transformer element 10 has an additional secondary electrode 13b and output terminal electrodes 13d and 13e like those in FIGS. 5 and 6. As a result, the FPC 17 has additional lugs 17d and 17e to be in contact with the output terminal electrodes 13d and 13e, respectively.

Figures 11, 12:
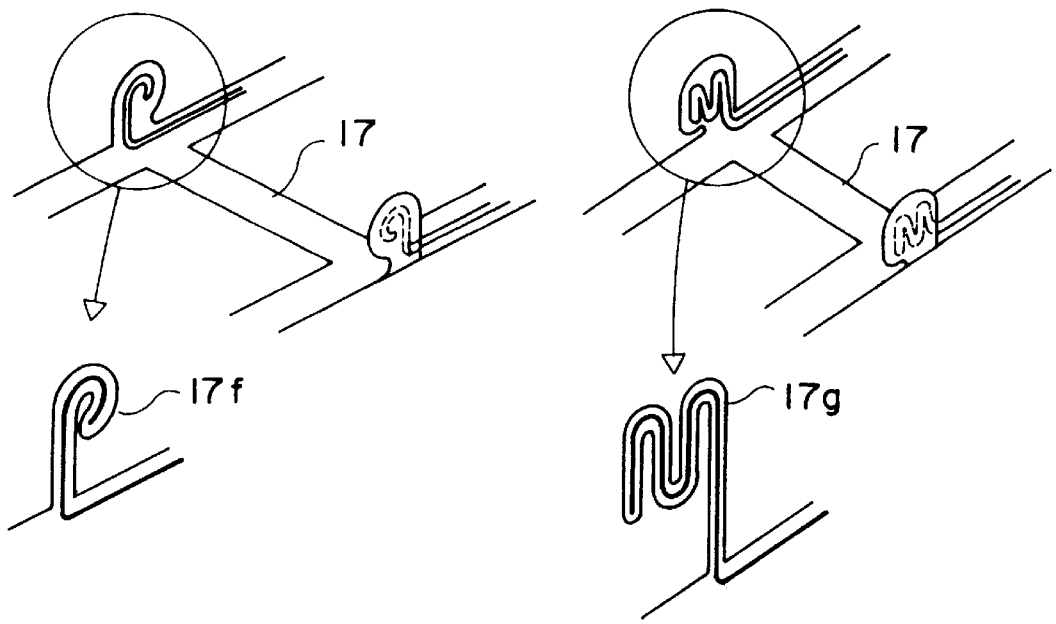
FIG. 11 is an example of a lag in a FPC of FIGS. 9 and 10.
FIG. 12 is another example of a lag in a FPC of FIGS. 9 and 10.
Figure 13:
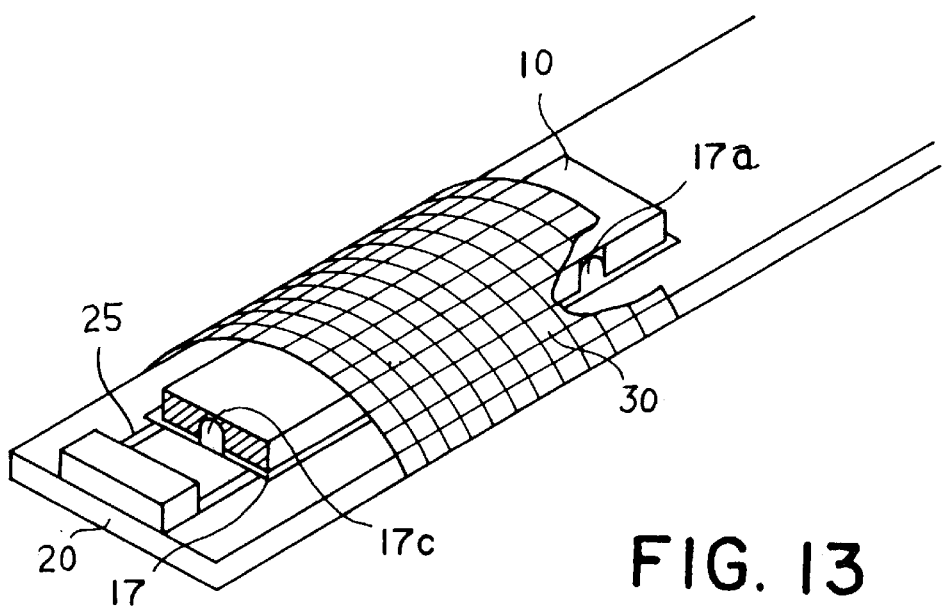
FIG. 13 is a perspective view of a power supply including the piezoelectric transformer shown in FIGS. 9–12.

Each of lugs 17a–17e in FIGS. 9 and 10 can have a shape adapted to insure to elastically support the transformer element 10 without bad affection to the vibration of the piezoelectric transformer element 10. In FIG. 11, the lug is shown to have a shape of one-turn wrapped lug 17f. While, the lug can have a zigzag shape shown at 17g in FIG. 12.

Each of the transformer element 10 of FIGS. 9 and 10 are mounted together with the corresponding FPC 17 onto the printed circuit board 20 and fixed by the wrapping sheet 30 to form the power supply like that in FIG. 7 or FIG. 8.

EXAMPLE 2

In the manner similar to Example 1, samples of transformer elements 10 in FIG. 9 and 10 were prepared. The sample transformer elements were mounted together with the corresponding FPC 17 in FIGS. 9 and 10 on printed circuit boards 20, respectively, to form the power supplies. Then, the test similar to Example 1 were performed for the power supplies. The measured data are shown in Table 2 together with that of the power supply with the conventional lead wires.

TABLE 2

|  | Lead Wire | FIG. 9 | FIG. 10 |
| --- | --- | --- | --- |
| Qm | — | 730 | 732 |
| Output Voltage (V) | 1410 | 1510 | 1515 |
| Output Current (mA) | 6 | 6.3 | 6.3 |
| Temperature (°C.) | 33 | 31 | 31 |

It is noted from Table 2 that the power supplies according to the embodiments of the present invention have properties similar to the power supply having a known transformer of the lead wire type.

Further, it was also confirmed from an aging test that the power supplies of FIGS. 9 and 10 did not degrade in its performances after use of 1000 hours or more.

Figure 14:
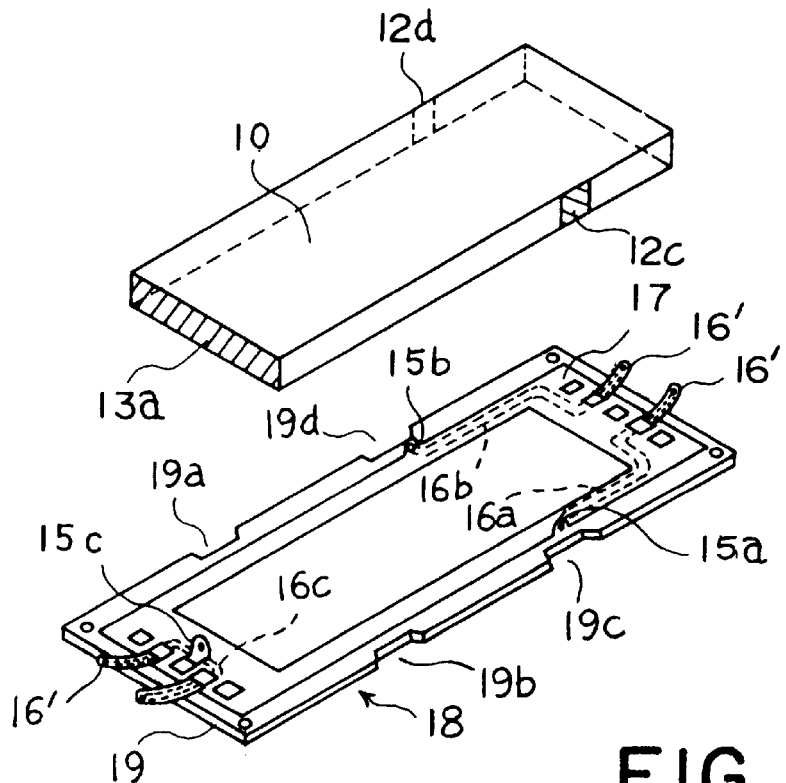
FIG. 14 is an exploded view of a piezoelectric transformer according to another embodiment of the present invention.

Referring to FIG. 14, the transformer shown therein according to another embodiment is is similar to that in FIG. 9 but is different therefrom in that the connection lead structure 18 is provided with a hard insulator plate 19 as a support of the FPC 17 and ribbon-like leads 16' for connecting the FPC 17 with the printed circuit board (not shown). The hard insulator plate can be made of, for example, glass-epoxy resin which is usually used for substrates of printed circuit boards.

The hard insulator plate 19 is rectangular and formed with a large central hole. The hard insulator plate 19 is formed with a plurality of (four) cut-away portions 19a–19d in the opposite side edges.

The FPC 17 is also rectangular and has a central large hole. The FPC 17 has three exposed conductor portions or terminals 15a–15c corresponding to the electrodes 12c, 12d, and 13a and strip-like conductors 16a–16c extending through the FPC from the terminals 15a–15c to the opposite ends of the FPC 17 as shown in the figure. The FPC 17 has ribbon-like leads 16' connected to the strip-like conductors and projecting from the opposite ends outwardly.

The FPC 17 is bonded to the hard insulator plate 19 by adhesive agent of such as silicone resin.

The piezoelectric transformer element 10 is put on the connection lead structure 18 and electrodes 12c, 12d and 13a are connected to the terminals 15a–15c, respectively.

Figure 15:
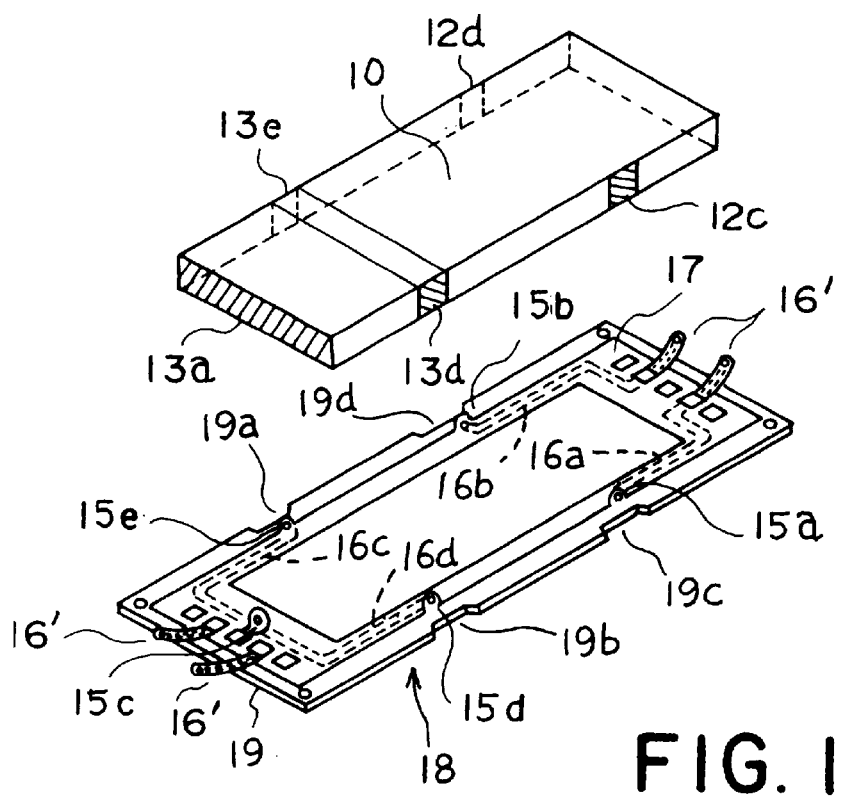
FIG. 15 is an exploded view of a piezoelectric transformer according to another embodiment of the present invention.

Referring to FIG. 15, there is shown a modification of that in FIG. 14. The transformer element 10 is provided with an additional secondary electrode 13b and output electrodes 13d and 13e connected thereto. Therefore, the connection lead structure 18 is further provided with terminals 15d and 15e corresponding to the output electrodes 13d and 13e and strip-like conductors 16c and 16d extending from the terminals 15d and 15e to the ribbon-like leads 16' at the opposite end of the FPC 17.

Figure 16:
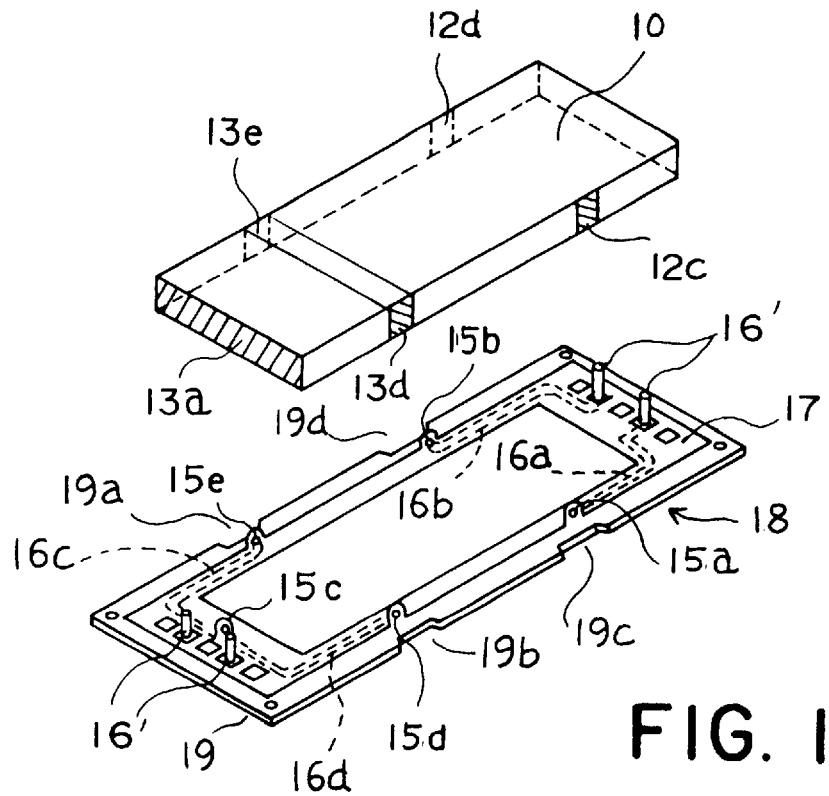
FIG. 16 is an exploded view of a piezoelectric transformer according to another embodiment of the present invention.

Referring to FIG. 16, there is a modification of that in FIG. 15. In the modification, pins are used in place of the ribbons as the leads 16' for connecting the FPC 17 with the printed circuit board.

Figure 17:
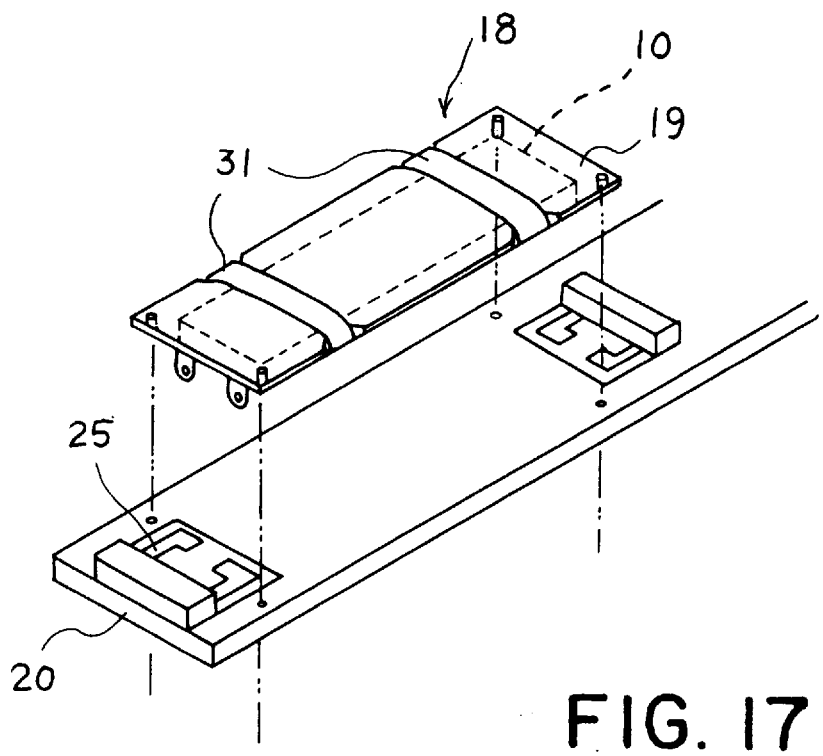
FIG. 17 is an exploded perspective view of a power supply including the piezoelectric transformer shown in FIGS. 14–16.

Each of piezoelectric transformer elements 10 in FIGS. 14, 15, and 16 is fixed to the corresponding one of the connection lead structures 18 in FIGS. 14, 15 and 16 by two wrapping belts 31 wrapped through the cut-away portions 19a–19d, and then, mounted onto the printed circuit board 20 to form the power supply, as shown in FIG. 17. The ribbons or pins 16' are soldered to the printed circuit board 20.

EXAMPLE 3

In the similar manner as described in Example 1, samples of piezoelectric transformer elements 10 shown in FIGS. 14–16 were prepared and were made up to the power supplies of the type as shown in FIG. 17.

The power supplies were tested in the similar manner in Example 1. The tested data are shown in Table 3.

TABLE 3

|  | FIG. 14 | FIG. 15 | FIG. 16 |
| --- | --- | --- | --- |
| Qm | 730 | 727 | 732 |
| Output Voltage (V) | 1480 | 1475 | 1483 |
| Output Current (mA) | 6.4 | 6.3 | 6.3 |
| Temperature (°C.) | 31 | 32 | 31 |

It is noted from Table 3 that the power supplies according to the embodiments of the present invention have properties similar to the power supply having a known transformer of the lead wire type shown in Tables 1 and 2.

Further, it was confirmed from an aging test that the power supplies using piezoelectric transformers of FIGS. 14, 15 and 16 did not degrade in its performances after use of 1000 hours or more.

Figure 18:
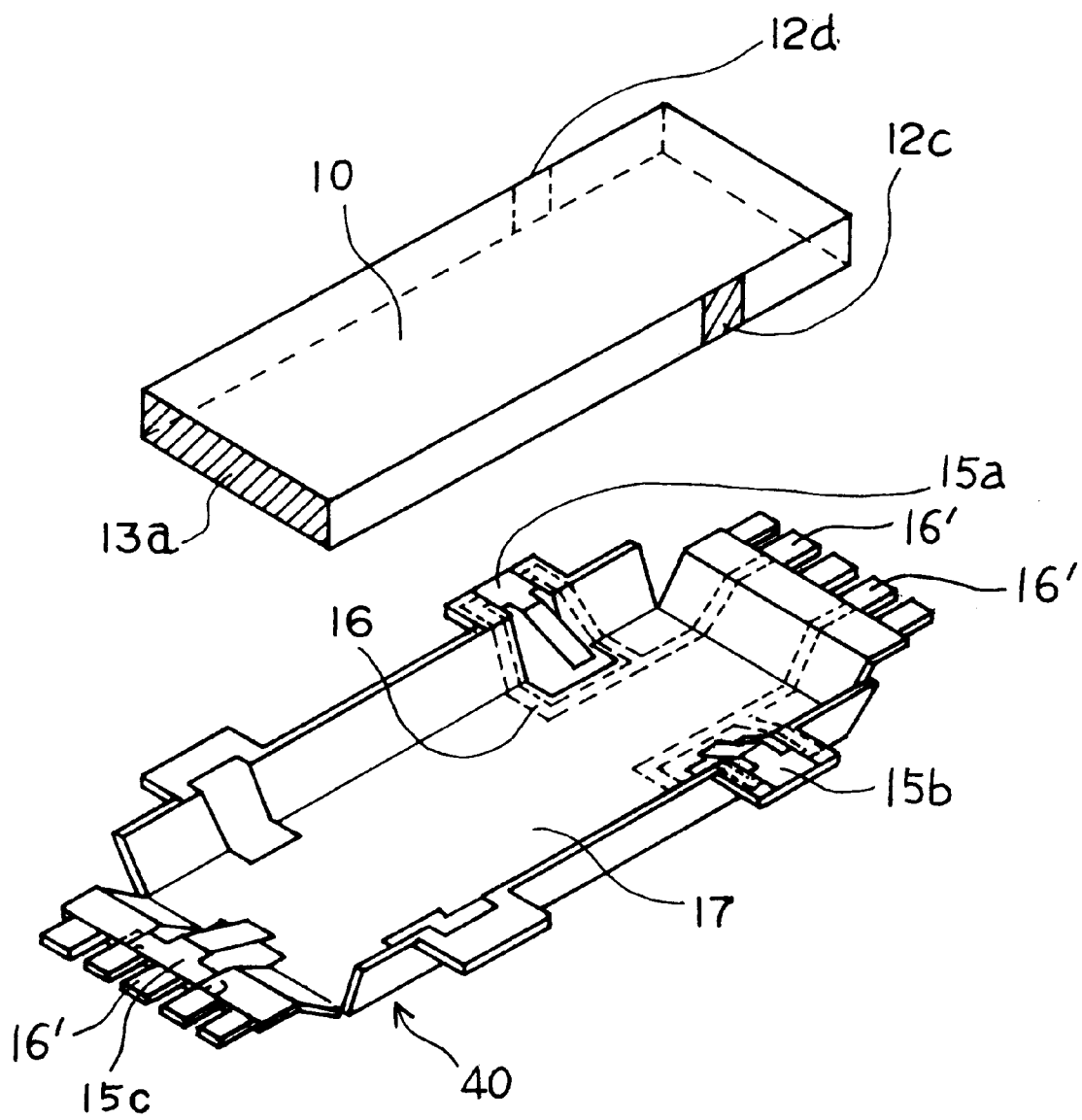
FIG. 18 is an exploded view of a piezoelectric transformer according to another embodiment of the present invention.

Referring to FIG. 18, there is shown another piezoelectric transformer with a different one of the connection lead structure 18 in comparison with FIG. 14.

The connection lead structure 18 is formed into a cover case made of flexible insulator sheet 17 and has strip-like conductors 16, lead pieces 16', and flat spring members as terminals 15a–15c. The spring members or terminals 15a–15c are made of elastic metal plate such as phosphor bronze. The flexible insulator sheet 17 having the strip-like conductors 16 may be an FPC and can be formed into the cover case together with the spring terminals 15a–15c and lead pieces 16' by the insert-molding method. Thus, the connection lead structure 18 will often be referred to as a cover case in this embodiment.

The piezoelectric transformer element 10 is inserted into the cover case 18 and is bonded at its vibration nodes to the cover case 18 by adhesive agent of such as silicone resin. The electrodes 12c, 12d and 13a are soldered to the spring terminals 15a–15c, respectively.

Figure 19:
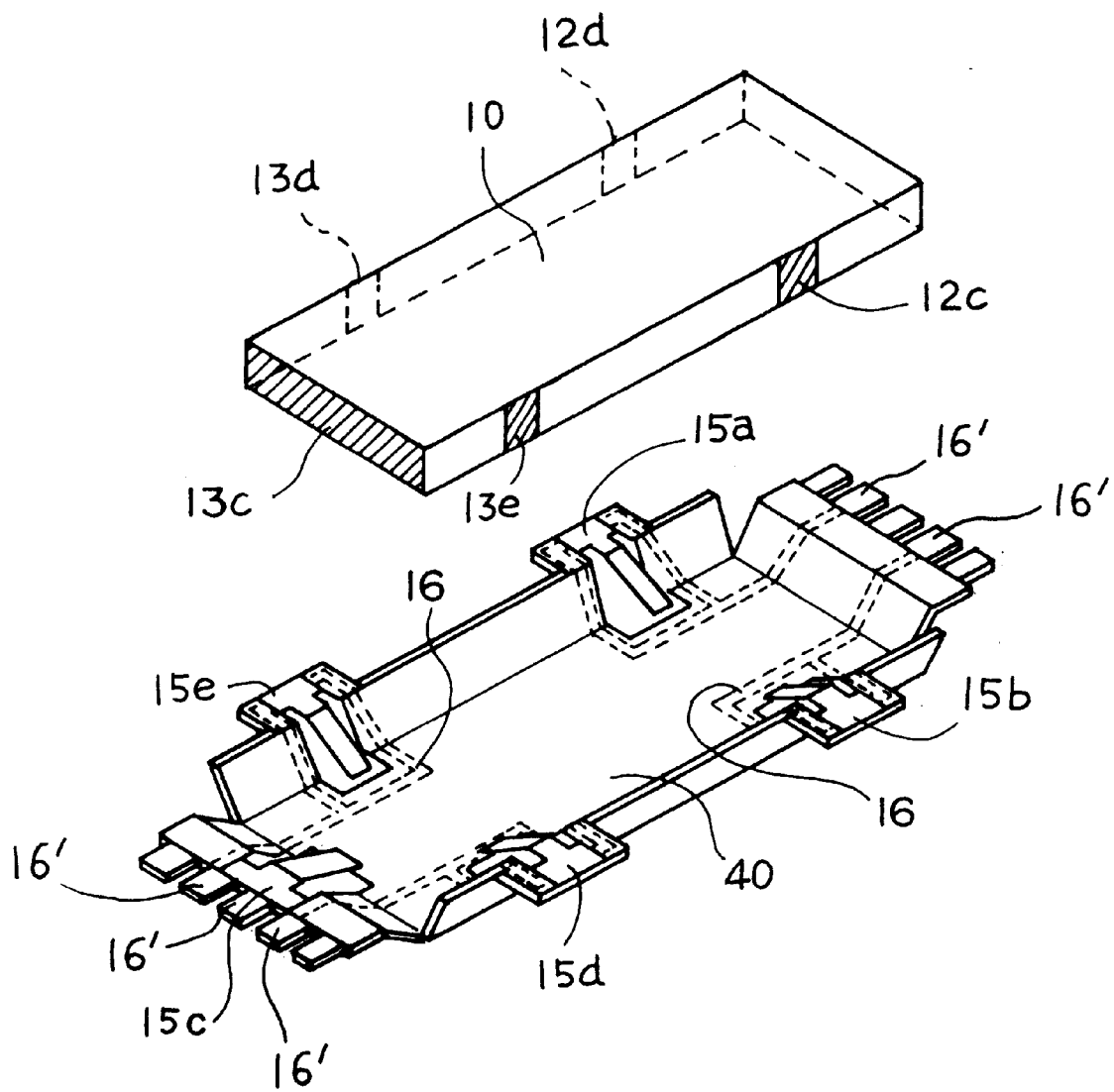
FIG. 19 is an exploded view of a piezoelectric transformer according to another embodiment of the present invention.

Referring to FIG. 19, there is shown a modification of FIG. 18 in which the piezoelectric transformer element 10 has additional output electrodes 13d and 13e and the cover case 18 is provided with additional spring members 15e and 15d corresponding thereto. The cover case 18 is further provided with additional strip-like conductors 16 connecting the additional spring terminals 15d and 15e with additional lead pieces 16'.

Figure 20:
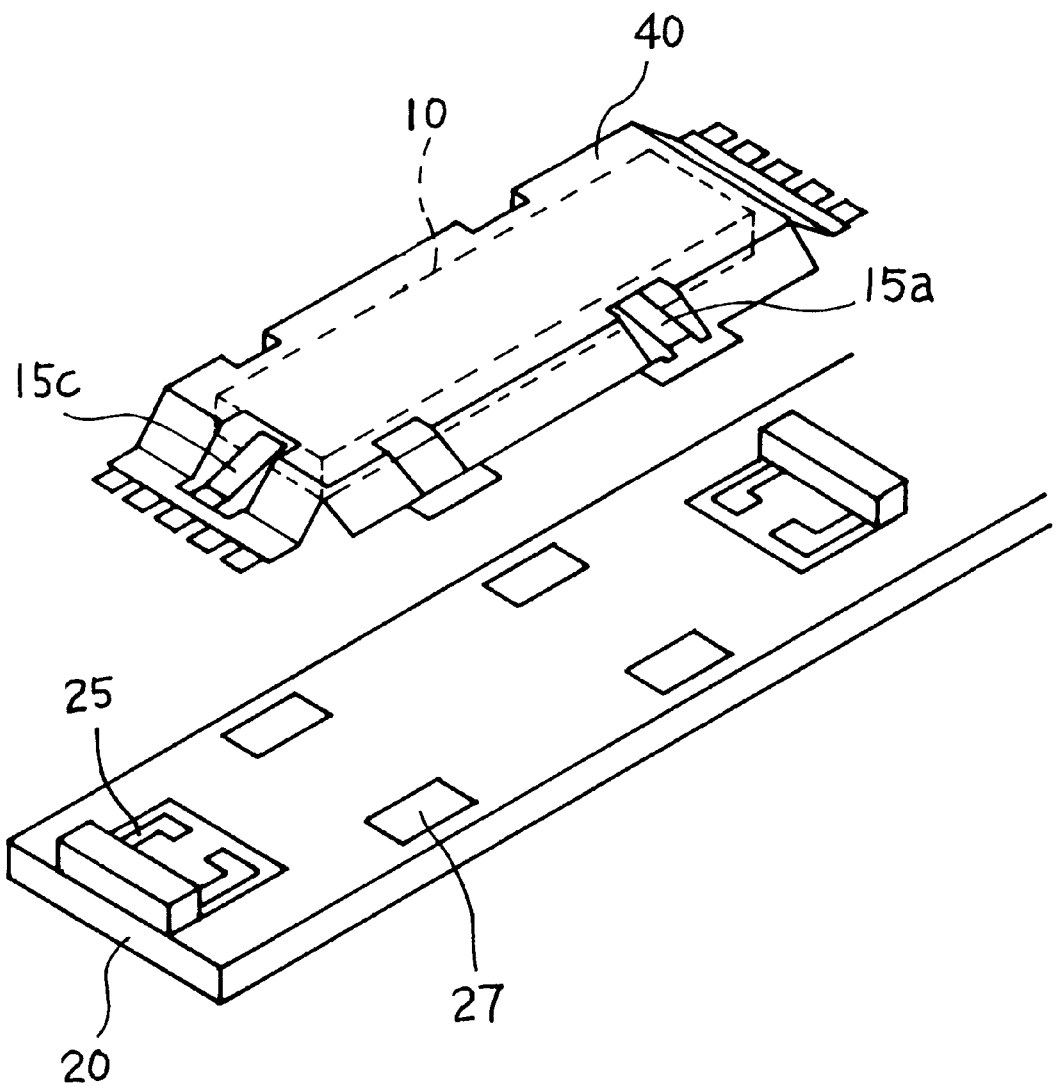
FIG. 20 is an exploded perspective view of a power supply including the piezoelectric transformer shown in FIGS. 18 and 19.

Referring to FIG. 20, each of the piezoelectric transformers 10 contained in the corresponding cover cases 18 in FIGS. 18 and 19 is put on the printed circuit board 20 and the spring terminals 15a–15e and lead pieces 16' are soldered to corresponding conductor patterns 27 and 25 on the printed circuit board 20 to form the power supply. The cover case 18 is bonded to the printed circuit board 20 by adhesive agent. Thus, the piezoelectric transformer can be mounted without use of the wrapping sheet but is covered with the cover case 18.

EXAMPLE 4

In the similar manner as described in Example 1, samples of piezoelectric transformer elements 10 shown in FIGS. 18–19 were prepared and were made up to the power supplies of the type as shown in FIG. 20.

The power supplies were tested in the similar manner in Example 1. The tested data are shown in Table 4.

TABLE 4

|  | FIG. 18 | FIG. 19 |
| --- | --- | --- |
| Qm | 750 | 745 |
| Output Voltage (V) | 1450 | 1445 |
| Output Current (mA) | 6.3 | 6.2 |
| Temperature (°C.) | 30 | 31 |

It is noted from Table 4 that the power supplies according to the embodiments of the present invention have properties similar to the power supply having a known transformer of the lead wire type shown in Tables 1 and 2.

Further, it was confirmed from an aging test that the power supplies using piezoelectric transformers of FIGS. 18 and 19 did not degrade in its performances after use of 1000 hours or more.

What is claimed is:

1. A piezoelectric transformer comprising a transformer element and a connection lead structure coupled to said transformer element for connecting said transformer element with an external circuit, said transformer element comprising:

a rectangular plate made of a piezoelectric ceramic and having a first surface and side surfaces;

at least one pair of primary electrodes provided to said rectangular plate for receiving a driving voltage as a primary voltage to drive vibration of said rectangular plate by the piezoelectric effect;

input terminal electrodes formed on said rectangular plate partially exposed on said first surface and connected to pair of electrodes, respectively; and at least one secondary electrode formed at a region of said rectangular plate where a voltage potential is generated by the vibration of said rectangular plate due to the piezoelectric effect, said secondary electrode having an output terminal electrode portion extending to expose on said first surface of said rectangular plate, and said connection lead structure comprising:

a flexible flat sheet of insulator material; and a plurality of conductor strips formed in said flat sheet and having connection portions partially exposed out of the flat sheet, said input and output terminal electrodes being mechanically and electrically connected to corresponding one of said connection portions in the condition that said transformer element stands on said flat sheet with said first surface of said rectangular plate overlying said flat sheet, wherein said flat sheet is generally in a shape of a ladder and has a plurality of lugs standing up from the ladder shape at positions corresponding to the input electrodes and the secondary and/or output electrodes, said conductor strips extending through and partially exposed out of said lugs.

2. A piezoelectric transformer as claimed in claim 1, wherein each of said lugs having a top end wrapped by one turn.

3. A piezoelectric transformer as claimed in claim 1, wherein each of said lugs having a top end formed in zigzag shape.

4. A piezoelectric transformer as claimed in claim 1 mounted on a printed circuit board having circuit components forming a power supply together with said piezoelectric transformer, wherein said printed circuit board has a define board region on which said piezoelectric transformer is mounted, and wherein a wrapping sheet wraps said transformer element, said connection lead structure and said defined board region of said printed circuit board to form a power supply.

5. A piezoelectric transformer comprising a transformer element and a connection lead structure coupled to said transformer element for connecting said transformer element with an external circuit, said transformer element comprising:

a rectangular plate made of a piezoelectric ceramic and having a first surface and side surfaces;

at least one pair of primary electrodes provided to said rectangular plate for receiving a driving voltage as a primary voltage to drive vibration of said rectangular plate by the piezoelectric effect;

input terminal electrodes formed on said rectangular plate partially exposed on said first surface and connected to pair of electrodes, respectively; and at least one secondary electrode formed at a region of said rectangular plate where a voltage potential is generated by the vibration of said rectangular plate due to the piezoelectric effect, said secondary electrode having an output terminal electrode portion extending to expose on said first surface of said rectangular plate, and said connection lead structure comprising:

a flexible flat sheet of insulator material; and a plurality of conductor strips formed in said flat sheet and having connection portions partially exposed out of the flat sheet, said input and output terminal electrodes being mechanically and electrically connected to corresponding one of said connection portions in the condition that said transformer element stands on said flat sheet with said first surface of said rectangular plate overlying said flat sheet, wherein said flat sheet has a shape of rectangle with a large central hole, said connection lead structure further comprises a hard insulator plate with a large central hole, said flat sheet also having a shape of rectangle with a large central hole and bonded onto said insulator plate, and lead means connected to said conductor strips and projecting from said connection lead structure for connecting with external circuit.

6. A piezoelectric transformer as claimed in claim 5, wherein said lead means are ribbon-like lead wires.

7. A piezoelectric transformer as claimed in claim 5, wherein said lead means are conductor pins.

8. A piezoelectric transformer as claimed in claim 7, which further comprises binding means which binds said transformer element to the connection lead structure.

9. A piezoelectric transformer as claimed in claim 8, wherein said binding means comprises two wrapping bands wrapping said transformer element and the connection lead structure together.

10. A piezoelectric transformer as claimed in claim 8 mounted on a printed circuit board having circuit components forming a power supply together with said piezoelectric transformer, wherein said printed circuit board has a defined board region on which said piezoelectric transformer is mounted, and wherein said transformer element and said connection lead structure bound together is mounted onto said defined board region of said printed circuit board to form a power supply.

11. A piezoelectric transformer comprising a transformer element and a connection lead structure coupled to said transformer element for connecting said transformer element with an external circuit, said transformer element comprising:

a rectangular plate made of a piezoelectric ceramic and having a first surface and side surfaces;

at least one pair of primary electrodes provided to said rectangular plate for receiving a driving voltage as a primary voltage to drive vibration of said rectangular plate by the piezoelectric effect;

input terminal electrodes formed on said rectangular plate partially exposed on said first surface and connected to pair of electrodes, respectively; and at least one secondary electrode formed at a region of said rectangular plate where a voltage potential is generated by the vibration of said rectangular plate due to the piezoelectric effect, said secondary electrode having an output terminal electrode portion extending to expose on said first surface of said rectangular plate, and said connection lead structure comprising:

a flexible flat sheet of insulator material; and a plurality of conductor strips formed in said flat sheet and having connection portions partially exposed out of the flat sheet, said input and output terminal electrodes being mechanically and electrically connected to corresponding one of said connection portions in the condition that said transformer element stands on said flat sheet with said first surface of said rectangular plate overlying said flat sheet, wherein said flat sheet is formed into a cover case, said cover case having spring members as terminal pieces as said connection portions.

12. A piezoelectric transformer as claimed in claim 11, wherein said transformer element is bonded at its vibration nodes to said cover case, said spring members are soldered to the corresponding ones of said input electrodes and said secondary and/or output electrodes.

13. A piezoelectric transformer as claimed in claim 12 mounted on a printed circuit board having circuit components forming a power supply together with said piezoelectric transformer, wherein said printed circuit board has a defined board region on which said piezoelectric transformer is mounted, and wherein said transformer element and said cover case bonded together is mounted onto said defined board region of said printed circuit board to form a power supply.

\* \* \* \* \*